United States Patent [19]

Sato

[11] Patent Number: 5,828,106
[45] Date of Patent: Oct. 27, 1998

[54] ESD TOLERATED SOI DEVICE

[75] Inventor: Noriaki Sato, Kawasaki, Japan

[73] Assignee: Fujitsu Limited, Kanagawa, Japan

[21] Appl. No.: 915,140

[22] Filed: Aug. 20, 1997

Related U.S. Application Data

[63] Continuation of Ser. No. 305,065, Sep. 13, 1994, abandoned.

[30]     Foreign Application Priority Data

Sep. 20, 1993 [DE] Germany ................................ 5233951

[51] Int. Cl.$^6$ .................................................. H01L 27/01
[52] U.S. Cl. .......................................... 257/350; 257/532
[58] Field of Search ..................... 257/350, 355, 257/356, 532, 534, 535, 653; 361/56, 91

[56]            References Cited

U.S. PATENT DOCUMENTS

| | | | |
|---|---|---|---|
| 4,989,057 | 1/1991 | Lu ............................................ | 257/357 |
| 5,155,573 | 10/1992 | Abe et al. ............................... | 257/532 |
| 5,202,751 | 4/1993 | Horiguchi .............................. | 257/532 |
| 5,378,919 | 1/1995 | Ochiai ..................................... | 257/350 |
| 5,499,207 | 3/1996 | Mihi et al. ............................... | 257/295 |

FOREIGN PATENT DOCUMENTS 6132561   2/1986   Japan ..................................... 257/355

OTHER PUBLICATIONS

Patent Abstracts of Japan, vol. 7, No. 58, Mar. 10, 1983.
Patent Abstracts of Japan, vol. 8, No. 200, Sep. 13, 1984.
Patent Abstracts of Japan, vol. 9, No. 39, Feb. 19, 1985.
Patent Abstracts of Japan, vol. 12, No. 375, Oct. 7, 1988.
Patent Abstracts of Japan, vol. 14, No. 268, Jun. 11, 1990.
Patent Abstracts of Japan, vol. 15, No. 506, Dec. 20, 1991.
Patent Abstracts of Japan, vol. 17, No. 568, Oct. 14, 1993.
Patent Abstracts of Japan, vol. 17, No. 672, Dec. 10, 1993.

*Primary Examiner*—Mark V. Prenty
*Attorney, Agent, or Firm*—Armstrong, Westerman, Hatori, McLeland & Naughton

[57]               ABSTRACT

A semiconductor-on-insulator (SOI) type semiconductor device with an enhanced electrostatic discharge (ESD) tolerance having a semiconductor layer on an insulating support substrate, comprising a pair of voltage supply lines formed on the semiconductor layer, a pair of low resistivity semiconductor regions connected to said pair of source supplying lines and disposed within the layer, and a dielectric region disposed between said pair of low resistivity semiconductor regions; wherein said pair of low resistivity semiconductor regions form a capacitor.

12 Claims, 7 Drawing Sheets

ESD TOLERATED SOI DEVICE

This application is a continuation of application Ser. No. 08/305,065 filed Sep. 13, 1994, now abandoned.

BACKGROUND OF THE INVENTION a) Field of the Invention

The present invention relates to a semiconductor device, and more particularly to a semiconductor-on-insulator (SOI) type semiconductor device with enhanced electrostatic discharge (ESD) tolerance.

b) Description of the Related Art

A semiconductor integrated circuit is often damaged when electrostatic charge intrudes from outside through a pin or the like and discharges within the circuit. Description will be made below referring as an example to a CMOS semiconductor integrated circuit.

FIGS. 3A to 3C show an example of protective countermeasure against ESD noise according to a prior art technique.

FIG. 3A shows a countermeasure circuit against ESD noise provided to a pad 50 for receiving an input signal.

A pad 50 is connected to a p-channel MOS transistor, or pMOS, and a n-channel MOS transistor, or nMOS, prior to being connected to internal circuits. The p-channel MOS transistor pMOS is connected between a line of supply voltage $V_{DD}$ and a signal line connected to the pad 50, and the n-channel MOS transistor nMOS is connected between the signal line connected to the pad 50 and a line of supply voltage $V_{SS}$.

Gate electrode of the pMOS is connected to its current electrode on the side of the supply voltage $V_{DD}$ (hereinafter called a source S) and gate electrode of the nMOS is connected to its current electrode on the side of the supply voltage $V_{SS}$ (hereinafter called a source S). The other current electrode will be referred to as drain. In a circuit as described, the pMOS and the nMOS are both in an OFF state as long as an input signal to the pad 50 has a potential between $V_{SS}$ and $V_{DD}$.

When a positive charge intrudes into the pad 50 and the potential of the pad becomes higher than $V_{DD}$, the relative role of a source S and a drain D of the pMOS is inverted. The positive charge flows from the drain D to the source S of the pMOS, and absorbed in the voltage source $V_{DD}$.

When a negative charge intrudes into the pad 50 and the potential of the pad becomes lower than $V_{SS}$, the relative role of a source S and a drain D of the nMOS is inverted. The negative charge flows from the drain D to the source S of the nMOS, and absorbed in a wiring of voltage source $V_{SS}$.

FIG. 3B is a sectional view showing an example of a configuration of an ESD protection circuit as shown in FIG. 3A.

Within a substrate 51 of an n-type Si, a p-type well 52 is formed. Within the p-type well 52, an n-channel MOS transistor is formed. Namely, $n^+$-type regions 53 and 54 are formed within the p-type well 52. Over a channel region defined between the $n^+$-type regions, an insulated gate electrode 55 is formed.

A $p^+$-type region 56 is also formed within the p-type well 52. The $p^+$-type region 56 and the $n^+$-type region 53 along with the gate electrode 55 are connected to the supply voltage $V_{SS}$. The other $n^+$-type region 54 is connected to the pad 50. In this configuration, the $n^+$-type region 53 defines a source, and the other $n^+$-type region 54 defines a drain of the n-channel MOS transistor as shown in FIG. 3A.

Here, a configuration described above provides an n-channel MOS transistor within the p-type well 52. It also provides, at the same time, a bi-polar transistor structure formed of the $n^+$-type region 54, the p-type well 52, and the n-type substrate 51.

As described above, when the electric potential of the pad 50 becomes equal to or less than $V_{SS}$, the role of the source S and the drain D is inverted, and a negative charge flows from the drain 54 to the source 53.

On the other hand, by controlling a thickness and impurity concentration of that region of the p-type well 52 between the $n^+$-type region 54 and the substrate 51, a punch-through current can be obtained from the $n^+$-type region 54 to the n-type substrate 51.

That is, as a negative charge intrudes into the pad 50 and increases the absolute value of the negative potential on the pad 50, a punch-through current is allowed to flow from the $n^+$-type region 54 to the substrate 51. And, at the same time, as the nMOS is switched ON, the negative charge also flows from the $n^+$-type region 54 to the voltage source $V_{SS}$ through the $n^+$-type region 53.

Here, an ESD current is similarly allowed to flow when a pMOS transistor is formed within an n-type region. Polarity of carriers and the conductivity types, however, are inverse.

Further, there is another path of the charge which leads to the well 52 through a pn junction formed between the drain diffusion layer 54 and the p-type well 52 in the form of a backward direction diode current. In this case, an ESD noise of a negative charge will either flow to $V_{SS}$ or the substrate through a junction of the drain of the nMOS, or to $V_{DD}$ or the substrate through a junction of the source of the pMOS. An ESD noise of a positive charge flows similarly with an exchange of the drain and the source.

FIG. 3C shows a case of forming a similar configuration for a ultra thin film semiconductor-on-insulator type CMOS integrated circuit device. On a support substrate 59 of an Si substrate, an insulating region 58 of $SiO_2$ is formed, and, on which insulating region, an nMOS transistor is constructed.

Namely, $n^+$-type regions 53 and 54 are disposed facing to each other, and a p-type channel 57 is disposed therebetween. An insulated gate electrode 55 is formed above the p-type channel 57. The $n^+$-type region 53 and the insulated gate electrode 55 are connected to a supply voltage $V_{SS}$, and the $n^+$-type region 54 is connected to a pad 50.

This construction does not allow a current from the nMOS to the substrate 59 due to its SOI structure. Consequently, there is an nMOS, but a bi-polar transistor, as was parasitically formed in the case of FIG. 3B, is not formed in this construction.

Further, since no well is constructed, no pn diode is formed beneath a drain diffusion layer.

In the performance of an ESD test, there is a case of applying a charge from a capacitor with voltage supply lines $V_{SS}$ and $V_{DD}$ kept in a floating state. Moreover, in a usual working condition, when an applied ESD noise is leaking to a voltage line $V_{SS}$ or $V_{DD}$, there occurs a case wherein the ESD noise is left unabsorbed because both of the lines are in a floating state. In such cases for a ultra thin film SOI-CMOS circuit, electric charge cannot be released, and, consequently, ESD failure may easily occur.

To countermeasure these troubles caused by ESD, such methods as providing an aperture at a part of embedded oxide layer, or forming a part of the SOI structure in a non-SOI structure, i.e. a CMOS structure which is the same as the bulk CMOS device. These methods enable electric charges to leak to the support substrate.

However, additional steps will have to be employed to provide an aperture at a part of the embedded oxide layer. Changing part of the SOI structure in a non-SOI structure reduces the merit of SOI structure, necessitates additional steps, and can yield breakage of wiring at stepping parts.

SUMMARY OF THE INVENTION

An object of the present invention is to provide an SOI type semiconductor device having an enhanced ESD tolerance.

According to one aspect of the present invention, there is provided a semiconductor-on-insulator (SOI) type semiconductor device having a semiconductor surface layer on an insulated support substrate comprising: a pair of voltage supply lines formed on the semiconductor surface layer; a pair of low resistivity semiconductor regions connected with the pair of voltage supply lines, disposed in the surface layer and dielectrically isolated from each other; and a dielectric region disposed between the pair of low resistivity semiconductor regions; wherein the pair of low resistivity semiconductor regions solely form a capacitor.

Since a capacitor is connected between a pair of voltage supply lines, an ESD failure becomes hard to be generated even when an ESD noise intrudes into a pad.

An SOI-type semiconductor device with enhanced ESD tolerance is provided without further complicating the whole process of manufacturing semiconductor devices.

BRIEF DESCRIPTION OF THE DRAWINGS

FIGS. 1A and 1B illustrate a basic embodiment of the present invention, wherein FIG. 1A is a sectional view, and FIG. 1B is a circuit diagram of an ESD protection circuit.

FIGS. 3A, 3B and 3C illustrate a prior art of ESD protection technique, wherein FIG. 3A is a circuit diagram and FIGS. 3B and 3C are sectional views of an ESD protection circuit.

DESCRIPTION OF THE PREFERRED EMBODIMENTS

Figure 1A:
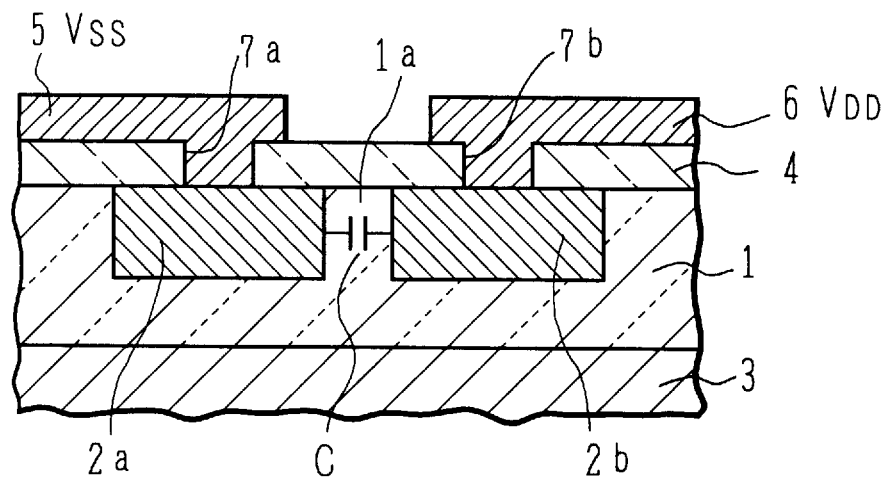
Figure 1B:
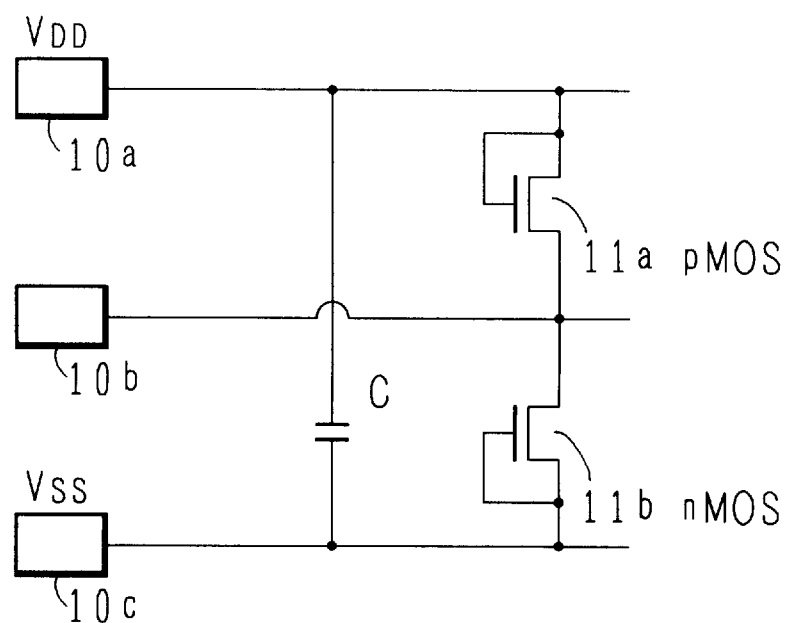

In FIGS. 1A and 1B, a structure of an SOI-type semiconductor device according to a basic embodiment of the present invention is shown. FIG. 1A shows a schematic sectional view of a part of an SOI-type semiconductor device and FIG. 1B shows a partial circuit diagram in part of the SOI-type semiconductor device.

In FIG. 1A, low resistivity semiconductor regions 2a and 2b are formed within an insulating region 1 on a surface of a support semiconductor substrate 3 of the SOI-type semiconductor device. A $V_{SS}$ line 5 and a $V_{DD}$ line 6 are connected to the low resistivity semiconductor regions 2a and 2b, respectively.

Here, the low resistivity semiconductor regions 2a and 2b is mutually isolated by a dielectric region 1a, and the surfaces thereof are covered by an insulating layer 4. The insulating layer 4 has contact holes 7a and 7b formed therein, to thereby enable the $V_{SS}$ line 5 and $V_{DD}$ line 6 to contact the low resistivity semiconductor regions 2a and 2b, respectively.

A capacitor C is formed between the low resistivity semiconductor regions 2a and 2b. The capacitor may be formed directly by closely disposing the low resistivity semiconductor regions 2a and 2b interposing the dielectric region 1a, or may be formed through capacitors formed by the low resistivity semiconductor regions 2a and 2b with the support semiconductor substrate 3 through the SOI insulating region 1. The low resistivity semiconductor regions 2a and 2b are regions provided only for forming the capacitor and do not have any other circuit function.

Here, at a part not shown in FIG. 1A, there are formed a series connection of pMOS and nMOS, which in turn is connected between the voltage supply lines $V_{SS}$ and $V_{DD}$.

FIG. 1B shows an equivalent circuit of such an ESD protection circuit. The supply voltage $V_{DD}$, an input signal, and the other supply voltage $V_{SS}$ are applied on pads 10a, 10b, and 10c, respectively.

A pMOS 11a is connected between a line connected to the pad 10a and a line connected to the pad 10b, and an nMOS 11b is connected between the line connected to the pad 10b and a line connected to the pad 10c. A capacitor C is further connected between the lines connected to the pads 10a and 10c.

When an ESD noise comes on the pad 10b, an electric charge flows into the line connected to the pad 10a or to the pad 10c according to a polarity thereof. Since the capacitor C is connected between the lines connected to the pads 10a and 10c, the incident charge is absorbed by the capacitor C.

FIGS. 2A to 2E show an embodiment of a method for forming two semiconductor regions buried in an insulating region as shown in FIG. 1A.

Figure 2A:
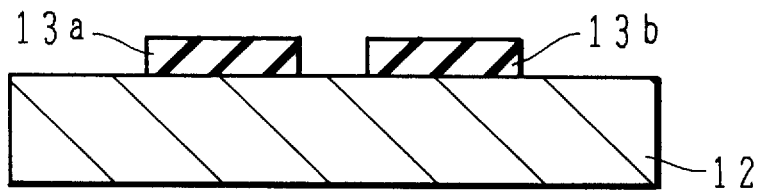
FIGS. 2A to 2E are schematic sectional diagrams illustrating a method of manufacturing a semiconductor device as shown in FIGS. 1A and 1B.

In FIG. 2A, masks 13a and 13b made of resist are formed on a semiconductor substrate 12 for forming a semiconductor device.

Figure 2B:
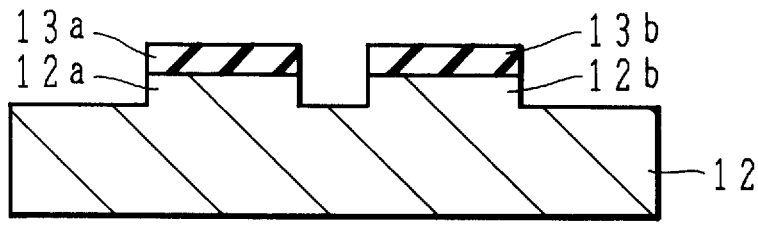
Figure 2C:
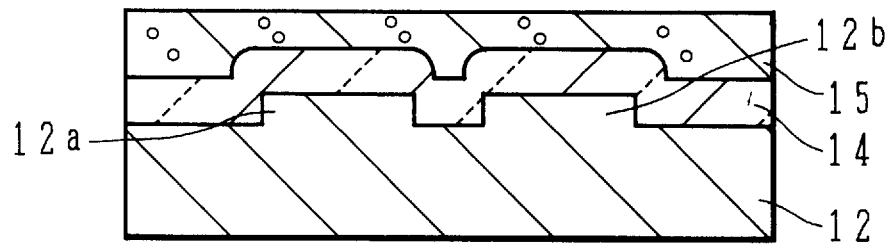

As shown in FIG. 2B, by using these masks 13a and 13b, etching, such as reactive ion etching (RIE), is performed to leave protruding semiconductor regions 12a and 12b unetched beneath the masks 13a and 13b. The masks 13a and 13b are removed thereafter.

As shown in FIG. 2B, on the semiconductor substrate formed with the protruding regions, an insulating layer 14 of $SiO_2$ and a polycrystalline semiconductor layer 15 of polycrystalline Si are laminated by chemical vapor deposition (CVD), or the like. The polycrystalline semiconductor layer 15, just after having laminated, has an uneven surface. The surface is then polished to obtain a flat surface as shown in the figure.

Figure 2D:
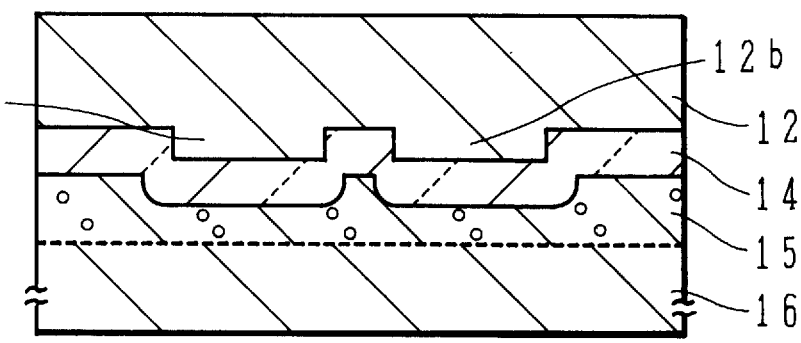

Next, as shown in FIG. 2D, a support substrate 16 made of Si substrate is prepared. The semiconductor substrate to be adhered is disposed thereon in such a way that the polycrystalline semiconductor layer 15 is disposed on a surface of this support substrate 16.

By maintaining this state at a high temperature of, for example, 1,000° C., the support substrate 16 and the substrate 12 to be adhered are adhered. The adhering step can be simplified and stabilized by employing such measures as application of a voltage, or application of both pressure and temperature.

Figure 2E:
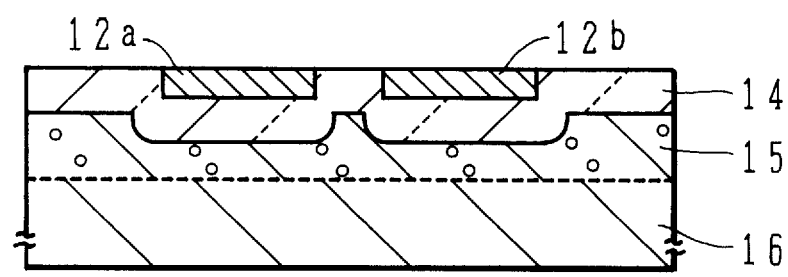

As shown in FIG. 2E, when the adhering step is finished, the adhered substrate 12 is polished away from the top, as shown in the figure, leaving only the protruded portions 12a and 12b. At this stage, the semiconductor regions 12a and 12b formed on the adhered substrate 12 are in a state left isolated in the insulating layer 14.

Here, the semiconductor regions 12a and 12b must have been doped with high concentration impurities at any stage of the process. The low resistivity semiconductor regions as shown in FIG. 1A are thus formed.

Here, the similar method can be employed to form a multiplicity of semiconductor regions buried in an insulating layer for forming such elements as pMOS, nMOS, or the like on each regions.

After forming an insulating layer on the adhered SOI substrate and contact holes therein, a semiconductor structure as shown in FIG. 1A is obtained by forming a wiring layer on an SOI structure thus obtained.

Here, in a structure as shown in FIG. 2E, the semiconductor regions 12a and 12b are disposed facing to a polycrystalline semiconductor layer 15 disposed on the support substrate 16 through the insulating layer 14. Namely, the semiconductor regions 12a and 12b form capacitors with the support substrate 16.

Various shapes of semiconductor regions are possible for forming capacitors for ESD protection.

Figure 4:
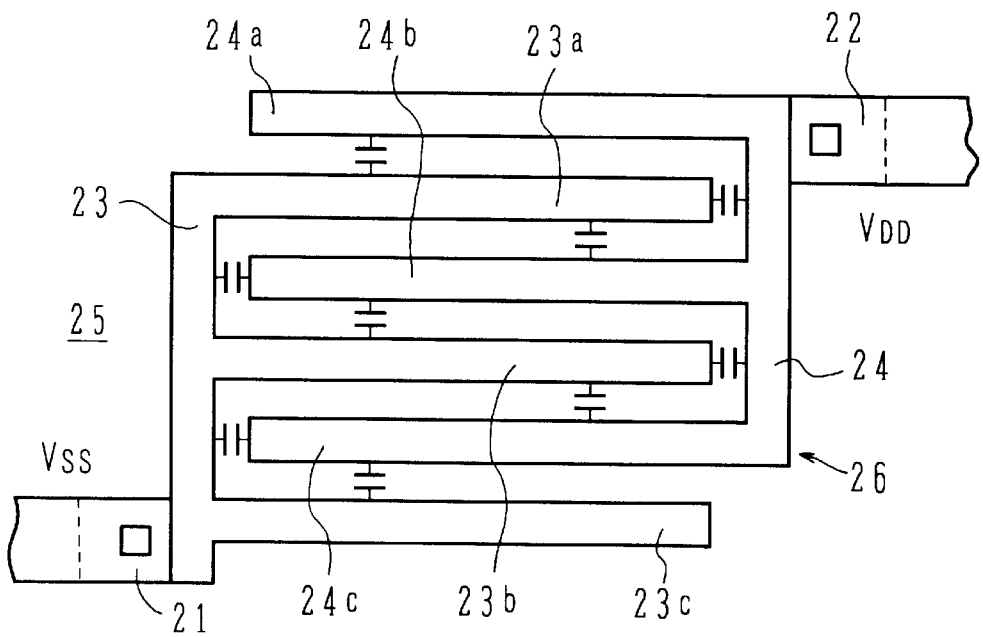
FIG. 4 is a plan view of an ESD protection capacitor according to an embodiment of the present invention.

FIG. 4 shows a planar configuration of an ESD protection capacitor according to an embodiment of the present invention. A low resistivity semiconductor region 23 disposed within an insulator region 25 has a shape that three branch-shaped parts 23a, 23b, and 23c extend from a common trunk part. Another semiconductor region 24 disposed within an insulator region 25 similarly has a shape that three branch-shaped parts 24a, 24b, and 24c extend from a common trunk part.

The semiconductor region 23 and the semiconductor region 24 are disposed inter-digitally that their respective branch-shaped parts 23a to 23c and 24a to 24c engage one another. The semiconductor region 23 is connected to a $V_{SS}$ supply line 21, and the semiconductor region 24 is connected to a $V_{DD}$ supply line 22.

The employment of such inter-digital structure increases an area of facing of the semiconductor region 23 and the semiconductor region 24, and also a capacitance of a capacitor formed therebetween.

Figure 5:
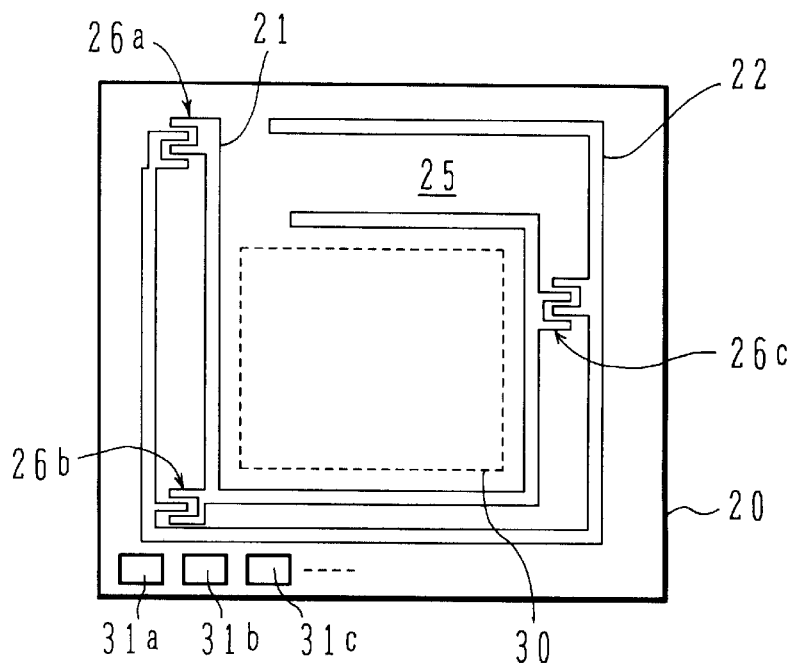
FIG. 5 is a plan view showing another configuration of an ESD protection capacitor within a chip according to another embodiment of the present invention.

FIG. 5 shows an example of disposition for distributing capacitors as shown in FIG. 4 on an integrated circuit chip. The semiconductor chip 20 has an integrated circuit part 30 formed at the central part thereof, and pads 31a, 31b, . . . formed at the peripheral part thereof. The $V_{SS}$ supply line 21 and the $V_{DD}$ supply line 22 are disposed between the central circuit part and the peripheral pad part in a way to surround the central part.

At plurality of positions between the $V_{SS}$ supply line 21 and the $V_{DD}$ supply line 22, ESD protection circuits 26 as shown in FIG. 4 are disposed. In a configuration as shown in the figure, three of the ESD protection circuits 26a, 26b, and 26c are shown. By disposing the capacitors distributedly, a uniform protection function along the whole dimensions of the supply lines is obtained.

Here, the number of the ESD protection circuits can be adjusted according to the necessity. The ESD protection circuits can also be formed on the full length of the $V_{SS}$ supply line 21 and the $V_{DD}$ supply line 22 facing to each other.

In a ultra thin film SOI-type CMOS circuit, a semiconductor film for forming a semiconductor device is provided to be extremely thin, for example, 0.1 $\mu$m. In such a case, the area of side surfaces of semiconductor regions which form a capacitor becomes smaller in accordance with a thickness thereof. To increase a capacitance, the thickness of a dielectric layer between the semiconductor regions may be reduced. However, when the thickness becomes very small, the withstand voltage of the capacitor becomes insufficient.

For example, when a dielectric layer of $SiO_2$ is used, a dielectric region with a width of approximately 0.5 $\mu$m is left between semiconductor regions disposed facing to each other. It is necessary to set the width of the dielectric layer between semiconductor regions sufficient for securing a width that does not allow a leak current of an order of non-negligible amount, and should be broad enough not to be dielectrically broken down. As a measure, a dielectric layer having a width of the order of minimum rule for optical exposure is to be taken.

An ESD noise which is generated by a human body or the like, typically, has a voltage of the order of 500 V. For relieving such ESD voltage, capacitance is preferably as large as possible.

Figure 6:
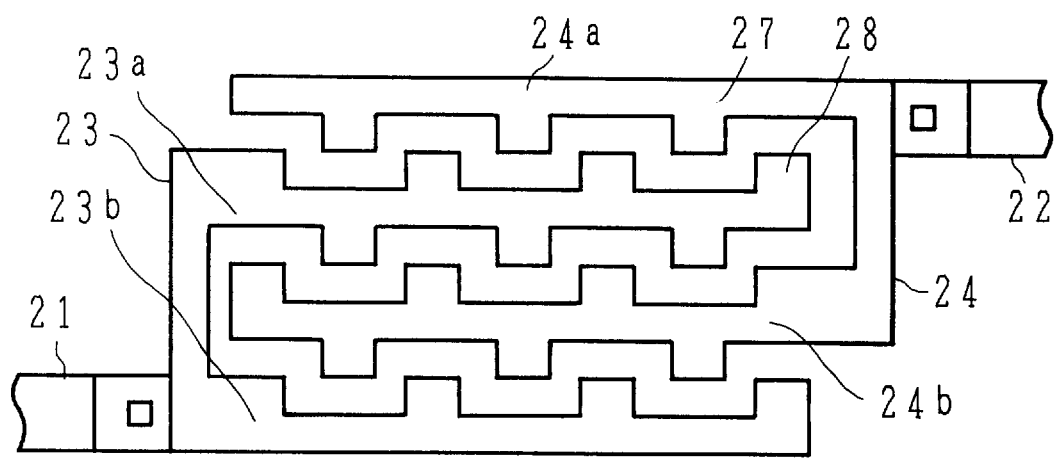
FIG. 6 is a plan view showing a further configuration of an ESD protection capacitor according to a further embodiment of the present invention.

FIG. 6 shows a planar shape adequate to increase a capacitance of a capacitor formed between semiconductor regions.

A semiconductor region 23 having two branch-shaped parts 23a and 23b is disposed facing to another semiconductor region 24 having similar two branch-shaped parts 24a and 24b. These branch-shaped parts 23a, 23b and 24a, 24b are disposed inter-digitally to engage one another.

Further, on each of the branch-shaped parts disposed facing to each other, protruded parts 28 protrude further from the branch-shaped part 23a, and protruded parts 27 also protrude from the branch-shaped part 24a. The protruded parts 27 and 28 are disposed to engage each other interchangingly. The length of circumference of parts facing to the other of the semiconductor regions 23 and 24 are increased by these protruded parts 27 and 28.

This means that an area of side surfaces of the semiconductor regions 23 and 24 is increased. By disposing these expanded area of the side surfaces facing to each other, a capacitance of a capacitor formed therebetween is also increased.

Figure 7:
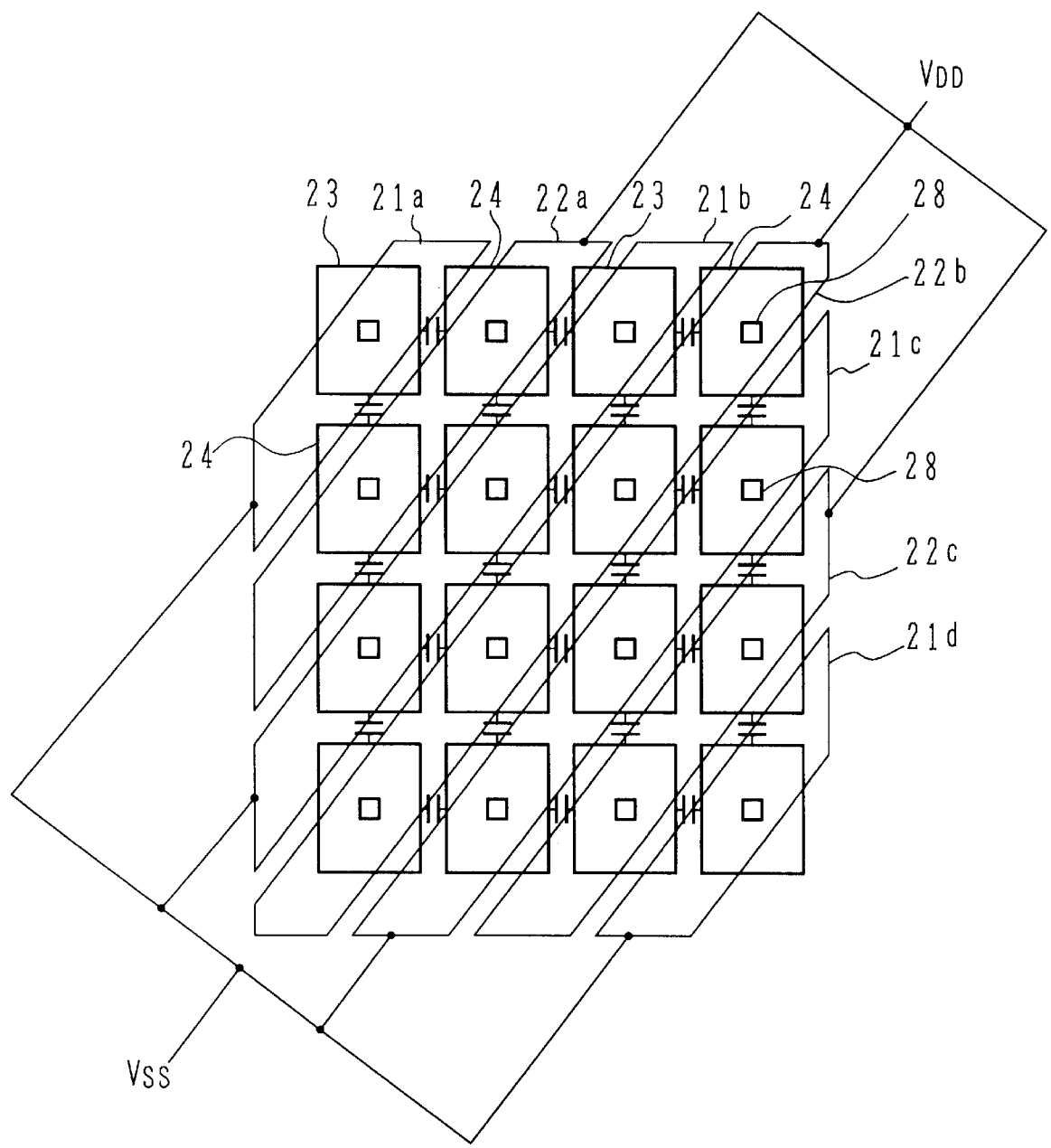
FIG. 7 is a plan view showing another configuration of an ESD protection capacitor according to another embodiment of the present invention.

FIG. 7 shows another example of the configuration of an ESD protection capacitor according to another embodiment of the present invention. Semiconductor regions 23 and 24 are disposed two-dimensionally in an alternative manner to form a pattern of a checker-board. A dielectric region is disposed around each of the semiconductor regions 23 and 24.

Over these semiconductor regions, voltage supply wirings 21a, 21b, 21c, 21d, and 22a, 22b, 22c, . . . are obliquely disposed alternatively as shown in the figure. Namely, the semiconductor regions 23 are connected with a $V_{SS}$ supply line 21 and the semiconductor regions 24 are connected with a $V_{DD}$ supply line 22. Consequently, each of the semiconductor regions 23 and 24 is surrounded by semiconductor regions connected to a different supply line, and capacitors are formed at the whole area of the side surface thereof.

In the present embodiment, it is also possible to reduce a voltage drop within the semiconductor regions to a negligible amount, as well as to increase a capacitance, by reducing the area on a main surface of each semiconductor region and by contacting the main surface thereof to a metal supply line.

Since the ESD noise has a high voltage, when there is a sharp edge of an angle smaller than 90° on a conductive region, the ESD noise is easily discharged thereat.

Figure 8:
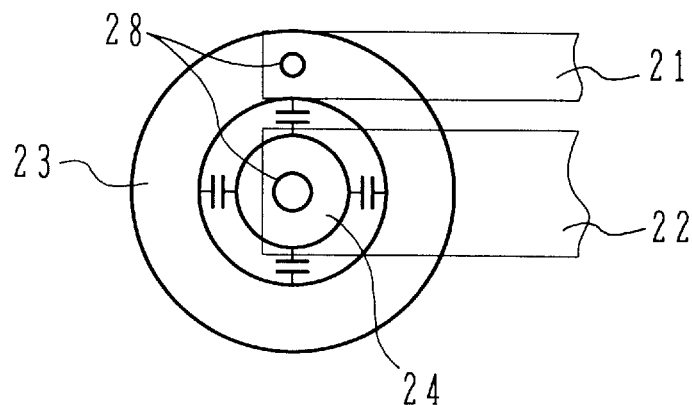
FIG. 8 is a plan view showing another configuration of an ESD protection capacitor according to another embodiment of the present invention.

FIG. 8 shows a configuration of the ESD protection capacitor with a high withstand voltage according to another embodiment of the present invention. A circular semiconductor region 24 and a ring-shaped semiconductor region 23 concentrically encircling therearound are formed within an insulating region, and a capacitor is formed therebetween.

A $V_{SS}$ supply line 21 and a $V_{DD}$ supply line 22 are disposed over these semiconductor regions via an insulating layer, and are connected with ohmic contacts to the ring-shaped semiconductor region 23 and the circular semiconductor region 24 through contact holes 28 formed in the insulating layer.

In this configuration, no sharp projection is formed on the facing surfaces of the semiconductor regions 23 and 24. Thus, an enhanced withstand voltage is obtained. It is thus possible to reduce a thickness (width) of the dielectric region between the semiconductor regions 23 and 24.

Here, the shape of these semiconductor regions are not necessarily be a circle, and may be any form like an ellipse or an elongated circle which forms a smooth curve (large radius of curvature). It may also be an obtuse angled polygon. When one of the supply wirings is grounded, the grounded supply wiring is preferably designed to be disposed outside.

In an SOI-type structure, semiconductor regions formed in a surface layer can form capacitors not only mutually with other regions, but also with a support substrate when a semiconductor substrate is employed as the support substrate.

Figure 9:
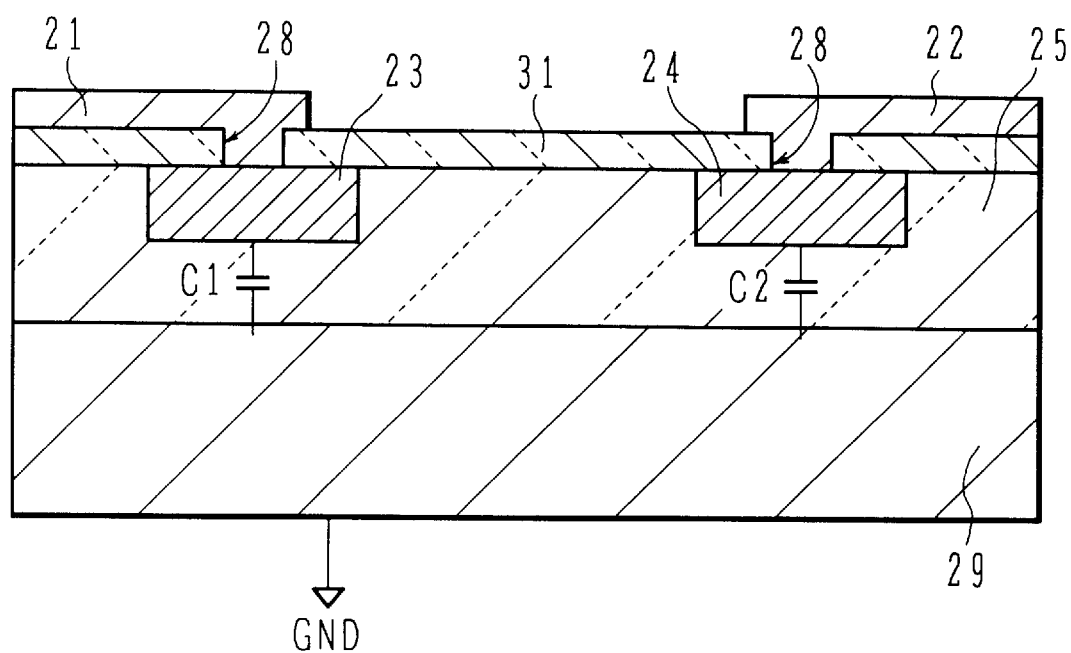
FIG. 9 is a sectional view showing schematically a construction of an ESD protection capacitor according to another embodiment of the present invention.

FIG. 9 shows a configuration of an ESD protection capacitor of an SOI-type semiconductor device according to another embodiment of the present invention. On a support Si substrate 29, an insulating layer 25 is disposed, wherein isolated semiconductor regions 23 and 24 are disposed within the insulating layer. The semiconductor regions 23 and 24 are disposed facing to the support substrate 29 through part of an insulating layer 25, and form capacitors C1 and C2.

Surfaces of the semiconductor regions 23 and 24 are covered with an insulating layer 31. The insulating layer 31 has contact holes 28 provided therethrough, and thereby to expose parts of the semiconductor regions 23 and 24. A $V_{SS}$ supply line 21 and a $V_{DD}$ supply line 22 are formed to cover these contact holes. Namely, the $V_{SS}$ supply line 21 and the $V_{DD}$ supply line 22 have an ESD protection capacitor connected therebetween and formed of the semiconductor region 23, the support substrate 29, and the semiconductor region 24.

Figure 3A:
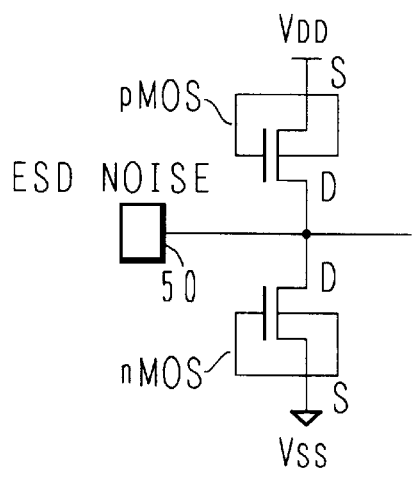
Figure 3B:
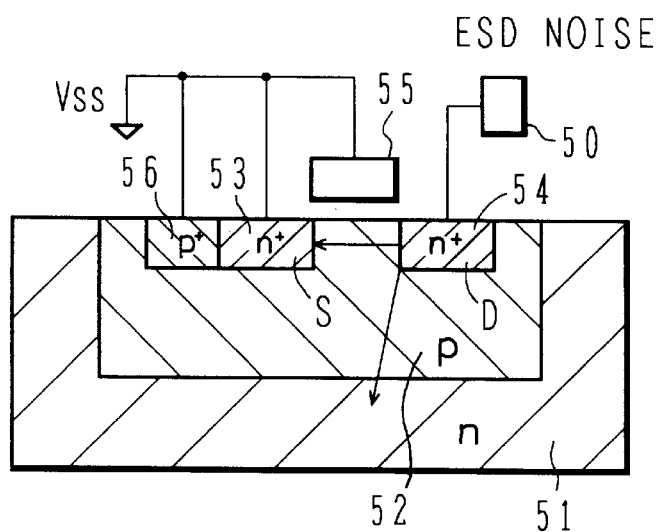
Figure 3C:
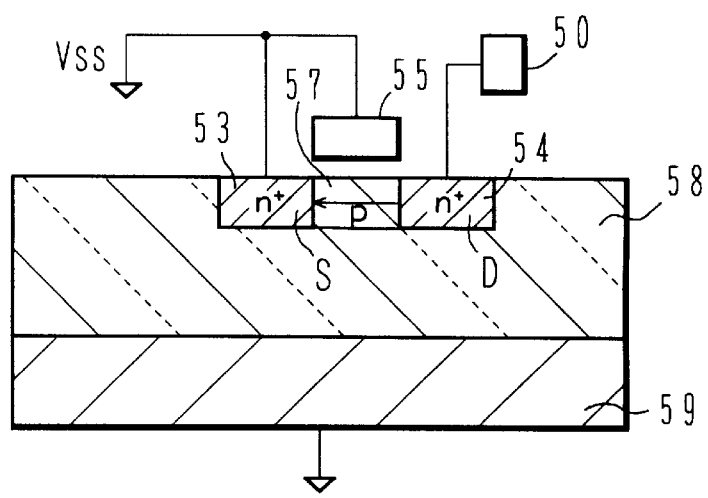

Here, in FIG. 1A, and FIGS. 4 through 9, only capacitor parts of the circuits for ESD protection are shown. However, MOS transistor structures, as shown in FIG. 3C, and ESD protection circuits, as shown in FIG. 1B, are also formed on other parts of the same semiconductor chip. The configuration as shown in FIGS. 1 and 4 through 8 and the configuration as shown in FIG. 9 can also be joined or combined to be used for an ESD protection circuit. The ESD protection capacitance is formed by a close disposition of doped semiconductor regions separated dielectrically. These semiconductor regions do not play the role of a constituent element in other circuit elements.

Although the present invention has been described in relation to preferred embodiments, it is not limited thereto. It will be apparent to those skilled in arts that various changes, substitutes, combinations and improvements can be made within the scope and spirit of the appended claims.

I claim:

1. A semiconductor-on-insulator (SOI) type semiconductor device comprising:

a support substrate having a top insulating layer, the insulating layer having a first surface;

semiconductor regions embedded in said insulating layer, and each having a second surface which forms a copolanar surface with said first surface;

a pair of voltage supply lines formed on said copolanar surface;

a plurality of active semiconductor regions among said semiconductor regions, constituting transistors of an integrated circuitry;

a pair of low resistivity semiconductor regions among said semiconductor regions, connected with said pair of voltage supply lines, disposed at a same level and exposed at said coplanar surface, and dielectrically isolated from each other; and a dielectric region formed of said insulating layer, disposed between said pair of low resistivity semiconductor regions;

wherein said pair of low resistivity semiconductor regions solely form a capacitor and do not constitute said integrated circuitry.

2. An SOI-type semiconductor device according to claim 1, wherein said support substrate comprises a semiconductor substrate, and an insulating layer formed on the semiconductor substrate and continuing to said dielectric region.

3. An SOI-type semiconductor device according to claim 2, wherein said pair of low resistivity semiconductor regions are disposed facing to each other on their side surfaces through said dielectric region, thereby forming a capacitance.

4. An SOI-type semiconductor device according to claim 3, wherein a plurality of said pair of low resistivity semiconductor regions is provided and connected to a pair of common voltage supply lines.

5. An SOI-type semiconductor device according to claim 3, wherein said pair of low resistivity semiconductor regions have such a shape, when projected on a surface of the support substrate, that the regions comprise parts of interdigital engagement.

6. An SOI-type semiconductor device according to claim 3, wherein peripheries of said pair of low resistivity semiconductor regions do not have a horizontal cross section in the layering direction having a bent part having an angle equal to or less than 90°.

7. An SOI-type semiconductor device according to claim 3, wherein said pair of low resistivity semiconductor regions have such a configuration that one of the regions surrounds the other of the regions.

8. An SOI-type semiconductor device according to claim 3, wherein said pair of low resistivity semiconductor regions are disposed in a checker board pattern with said pair of voltage supply lines connected alternately.

9. A semiconductor-on-insulator (SOI) type semiconductor device comprising:

a semiconductor substrate;

an insulating layer formed on said semiconductor substrate;

a plurality of active semiconductor regions disposed at a same level in said insulating layer constituting transistors of an integrated circuitry;

a pair of low resistivity semiconductor regions isolated from each other and disposed at said same level in said insulating layer, said pair of low resistivity semiconductor regions and said plurality of active semiconductor regions forming a coplanar surface;

a pair of voltage supply lines formed on said coplanar surface;

wherein said pair of low resistivity semiconductor regions form a capacitor through capacitive coupling with said semiconductor substrate and do not constitute said integrated circuitry.

10. An SOI-type semiconductor device according to claim 1, wherein said capacitor is disposed outside of said integrated circuitry.

11. An SOI-type semiconductor device according to claim 9, wherein said capacitor is disposed outside of said integrated circuitry.

12. An SOI-type semiconductor device according to claim 9, wherein said pair of voltage supply lines are connected to said pair of low resistivity semiconductor regions.

* * * * *